(12) United States Patent
Kurahashi

(10) Patent No.: US 8,956,935 B2
(45) Date of Patent: Feb. 17, 2015

(54) METHOD FOR MANUFACTURING COMPOUND SEMICONDUCTOR DEVICE

(71) Applicant: Fujitsu Limited, Kawasaki-shi, Kanagawa (JP)

(72) Inventor: Naoko Kurahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/224,524

(22) Filed: Mar. 25, 2014

(65) Prior Publication Data

US 2014/0206159 A1 Jul. 24, 2014

Related U.S. Application Data

(62) Division of application No. 13/334,734, filed on Dec. 22, 2011, now Pat. No. 8,729,604.

(30) Foreign Application Priority Data

Feb. 10, 2011 (JP) .................. 2011-027670

(51) Int. Cl.
*H01L 21/338* (2006.01)
*H01L 21/335* (2006.01)
*H01L 29/66* (2006.01)
*H01L 29/423* (2006.01)
*H01L 29/778* (2006.01)
*H03F 1/32* (2006.01)
*H01L 29/20* (2006.01)
*H01L 29/40* (2006.01)

(52) U.S. Cl.
CPC .... *H01L 29/66431* (2013.01); *H01L 29/42316* (2013.01); *H01L 29/4232* (2013.01); *H01L 29/66462* (2013.01); *H01L 29/7787* (2013.01); *H03F 1/3247* (2013.01); *H01L 29/2003* (2013.01); *H01L 29/402* (2013.01)

USPC ............. 438/172; 438/173; 438/586; 257/76; 257/192; 257/194; 257/220; 257/E21.403; 257/E29.089; 257/E29.246

(58) Field of Classification Search
USPC ............ 438/172, 173, 586; 257/76, 192, 194, 257/220, E21.403, E29.089, E29.246
See application file for complete search history.

(56) References Cited

U.S. PATENT DOCUMENTS

| | | | |
|---|---|---|---|
| 2006/0019435 A1 | 1/2006 | Sheppard et al. | |
| 2011/0024797 A1* | 2/2011 | Nakazawa et al. | 257/194 |
| 2011/0089468 A1* | 4/2011 | Zhang | 257/194 |
| 2012/0068227 A1* | 3/2012 | Hikita et al. | 257/194 |
| 2013/0105808 A1* | 5/2013 | Wong et al. | 257/76 |

FOREIGN PATENT DOCUMENTS

| | | |
|---|---|---|
| JP | 2000-252299 | 9/2000 |
| JP | 2008507843 A | 3/2008 |

OTHER PUBLICATIONS

Japanese Office Action dated Dec. 2, 2014 for corresponding Patent Application No. 2011-027670.

* cited by examiner

*Primary Examiner* — Dao H Nguyen
(74) *Attorney, Agent, or Firm* — Kratz, Quintos & Hanson, LLP

(57) ABSTRACT

A compound semiconductor device includes: a compound semiconductor multilayer structure; a gate insulating film on the compound semiconductor multilayer structure; and a gate electrode, wherein the gate electrode includes a gate base portion on the gate insulating film and a gate umbrella portion, and a surface of the gate umbrella portion includes a Schottky contact with the compound semiconductor multilayer structure.

7 Claims, 11 Drawing Sheets

US 8,956,935 B2

METHOD FOR MANUFACTURING COMPOUND SEMICONDUCTOR DEVICE

CROSS-REFERENCE TO RELATED APPLICATION

This application is a Divisional application of Ser. No. 13/334,734 filed on Dec. 22, 2011, which claims the benefit of priority from Japanese Patent Application No. 2011-27670 filed on Feb. 10, 2011, the entire contents of both of which are incorporated herein by reference.

FIELD

This disclosure relates to a compound semiconductor device, a method for manufacturing the device and an electric device.

BACKGROUND

A nitride semiconductor device featuring high saturation electron velocities, wide band gaps and the like may be used as high-voltage and high-output semiconductor devices. Nitride semiconductor devices may include field effect transistors and high electron mobility transistors (HEMTs), for example, an AlGaN/GaN HEMT that includes a GaN electron transit layer and an AlGaN electron supply layer may also be included. AlGaN of the AlGaN/GaN HEMT may bear a distortion caused by a difference in lattice constant between GaN and AlGaN. Highly concentrated two dimensional electron gas (2DEG) may be obtained based on the piezoelectric polarization and spontaneous polarization of AlGaN.

The band gap of GaN may be 3.4 eV which is larger than the band gap of Si (1.1 eV) or the band gap of GaAs (1.4 eV) and GaN may have a high breakdown electric field intensity. Since GaN has a high saturation electron velocity, GaN may be used in semiconductor devices for high-output power supplies operating under high voltage. The nitride semiconductor device may be used in high-efficiency switching elements, high-voltage high-output devices for electric vehicles, etc.

The related technology is disclosed in Japanese Laid-open Patent Publication No. 2000-252299, for example.

SUMMARY

According to one aspect of the embodiments, a compound semiconductor device includes: a compound semiconductor multilayer structure; a gate insulating film on the compound semiconductor multilayer structure; and a gate electrode, wherein the gate electrode includes a gate base portion on the gate insulating film and a gate umbrella portion, and a surface of the gate umbrella portion includes a Schottky contact with the compound semiconductor multilayer structure.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1A:
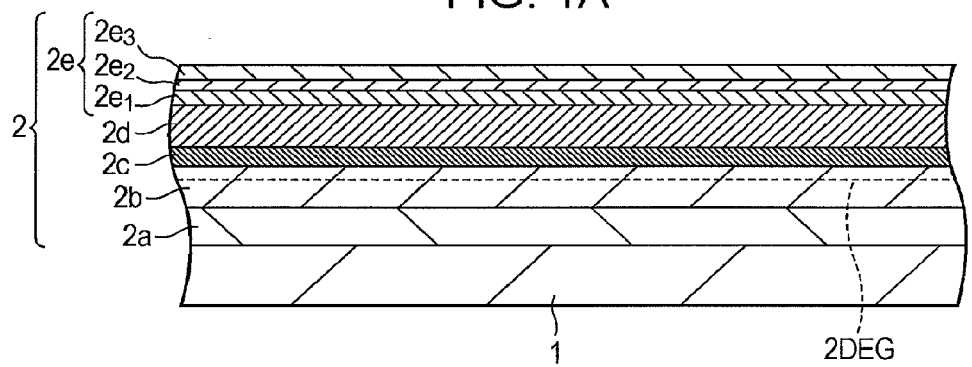
FIGS. 1A to 1H illustrate an exemplary method for producing a compound semiconductor device.

When a nitride semiconductor device is used in a power supply, the nitride semiconductor device may be configured as a normally off (enhancement type) device having low loss and high breakdown voltage in which a current does not flow when the gate voltage is off. For example, a HEMT that operates in a normally off mode under high breakdown voltage may be of a metal-insulator-semiconductor (MIS)-type that includes a gate insulating film under the gate electrode. An electron supply layer or an electron transit layer of a gate portion have an electrode groove formed by etching so as to increase the threshold value. A gate electrode is embedded in the electrode groove and may decrease the number of electrons in the electron transit layer (gate recess structure).

Electric field concentration may occur in one end portion of a gate electrode of a MIS-type HEMT and the current collapse characteristic may be degraded. In a gate recess structure, the electric field concentration may increasingly occur and the current collapse characteristic may be degraded.

The compound semiconductor device may be a MIS-type AlGaN/GaN HEMT. In the drawings, the relative size and thickness may not be illustrated accurately.

FIGS. 1A to 1H illustrate an exemplary method for manufacturing a compound semiconductor device. The compound semiconductor device manufactured as illustrated in FIGS. 1A to 1H may be a MIS-type AlGaN/GaN HEMT.

Referring to FIG. 1A, a compound semiconductor multilayer structure 2 is formed on, for example, a semi-insulating SiC substrate 1 serving as a deposition substrate. The compound semiconductor multilayer structure 2 may include a buffer layer 2a, an electron transit layer 2b, an intermediate layer 2c, an electron supply layer 2d, and a cap layer 2e. Two-dimensional electron gas (2DEG) may be generated near the interface between the electron transit layer 2b and the electron supply layer 2d, for example, the intermediate layer 2c. In the drawing, 2DEG is indicated by a broken line.

Compound semiconductor layers are formed on the SiC substrate 1 by, for example, metal organic vapor phase epitaxy (MOVPE). Alternatively, the compound semiconductor layers may be formed by molecular beam epitaxy (MBE) or the like.

The buffer layer 2a, the electron transit layer 2b, the intermediate layer 2c, the electron supply layer 2d, and the cap layer 2e are stacked on the SiC substrate 1. These layers may be stacked continuously. The buffer layer 2a may include AlN. The electron transit layer 2b may include an intentionally undoped GaN (i-GaN). The intermediate layer 2c may include i-AlGaN. The electron supply layer 2d may include n-AlGaN. The cap layer 2e may include three layers of compound semiconductors, e.g., n-GaN2e$_1$, AlN2e$_2$, and n-GaN2e$_3$.

The thickness of the buffer layer 2a may be about 0.1 μm. The thickness of the electron transit layer 2b may be about 3 μm. The thickness of the intermediate layer 2c may be about 5 nm. The thickness of the electron supply layer 2d may be about 20 nm. The Al ratio in each layer may be about 0.2 to about 0.3, for example. The thickness of n-GaN2e$_1$ in the cap layer 2e may be about 2 nm to 3 nm. The thickness of AlN2e$_2$ in the cap layer 2e may be about 2 nm to 3 nm. The thickness of n-GaN2e$_3$ in the cap layer 2e may be about 5 nm.

A mixed gas containing trimethylaluminum gas, trimethylgallium gas, and ammonia gas may be used as a source gas for forming AlN, GaN, and AlGaN. Whether to supply trimethylaluminum gas, i.e., Al source gas, or trimethylgallium gas, i.e., Ga source gas, and the flow rate of the supplied gas may be adequately set depending on the type of the compound semiconductor layer to be formed. The flow rate of the ammonia gas, which is a common raw material, may be about 100 ccm to 10 LM. The deposition pressure may be about 50 Torr to 300 Torr. The deposition temperature may be about 1000° C. to 1200° C.

Gas including Si as an n-type impurity, e.g., SiH$_4$ gas, may be added to the source gas at a certain flow rate in order to form n-type, Si-doped GaN and AlGaN. The Si doping concentration may be about $1\times10^{18}/cm^3$ to about $1\times10^{20}/cm^3$ and may be about $5\times10^{18}/cm^3$, for example.

Figure 1B:
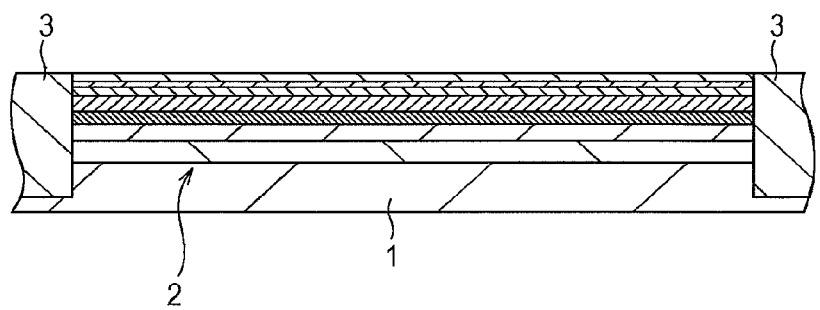

Referring now to FIG. 1B, an element isolation structure 3 is formed. For example, argon (Ar) may be doped into an element isolation region of the compound semiconductor multilayer structure 2. The element isolation structure 3 is formed in the compound semiconductor multilayer structure 2 and a surface layer portion of the SiC substrate 1. The element isolation structure 3 defines an active region, e.g., an element region, on the compound semiconductor multilayer structure 2. The element isolation structure 3 may be formed by a shallow trench isolation (STI) method, for example.

Figure 1C:
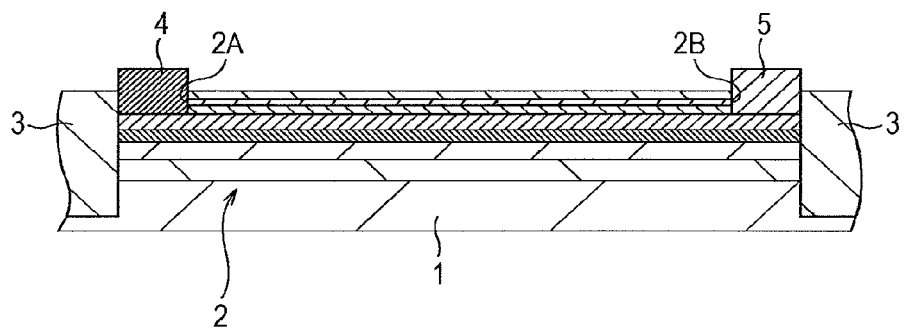

Referring to FIG. 1C, a source electrode 4 and a drain electrode 5 are formed. Electrode grooves 2A and 2B are formed in the cap layer 2e of the compound semiconductor multilayer structure 2 where the source electrode 4 and the drain electrode 5 are to be formed. The electrode grooves 2A and 2B may penetrate the cap layer 2e and reach the layer underneath. For example, electrode grooves 2A and 2B that penetrate the cap layer 2e, the electron supply layer 2d, and the intermediate layer 2c and reach a surface layer portion of the electron transit layer 2b may be formed.

A resist mask that has openings at positions corresponding to the positions of the compound semiconductor multilayer structure 2 where the source electrode and the drain electrode are to be formed is formed. The cap layer 2e is dry-etched using the resist mask until part of the surface of the electron supply layer 2d is exposed. As a result, the electrode grooves 2A and 2B are formed. Inert gas such as Ar and a chlorine gas such as Cl$_2$ or the like may be used as the etching gas. The flow rate of Cl$_2$ may be, for example, 30 sccm, the pressure may be 2 Pa, and RF input power may be 20 W.

Ti/Al may be used as the electrode material, for example. Electrodes may be formed by using a two-layer resist having a canopy structure suitable for a vapor deposition method and a lift-off method. A resist is applied to the compound semiconductor multilayer structure 2 and a resist mask for opening the electrode grooves 2A and 2B are formed. Ti/Al is deposited using the resist mask. The thickness of Ti may be about 20 nm and the thickness of Al may be about 200 nm. The resist mask having a canopy structure and Ti/Al deposited on the resist mask are removed by a lift-off method. For example, the SiC substrate 1 is heat-treated in a nitrogen atmosphere at about 550° C. and the remaining Ti/Al makes ohmic contact with the electron supply layer 2d. As a result, the source electrode 4 and the drain electrode 5 are formed while the electrode grooves 2A and 2B are filled with a lower part of the Ti/Al.

Figure 1D:
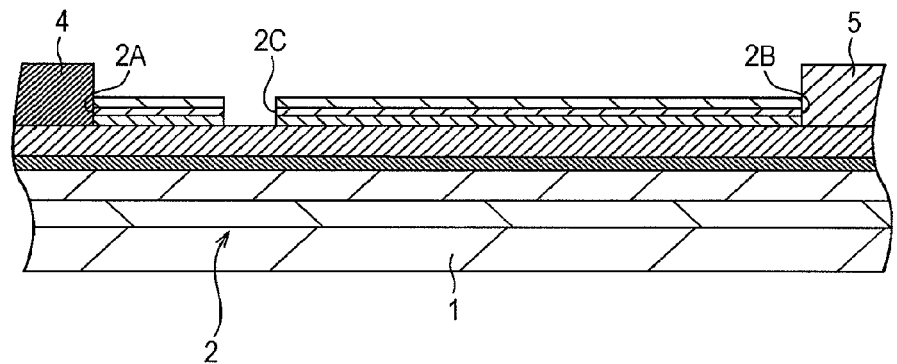
Figure 1E:
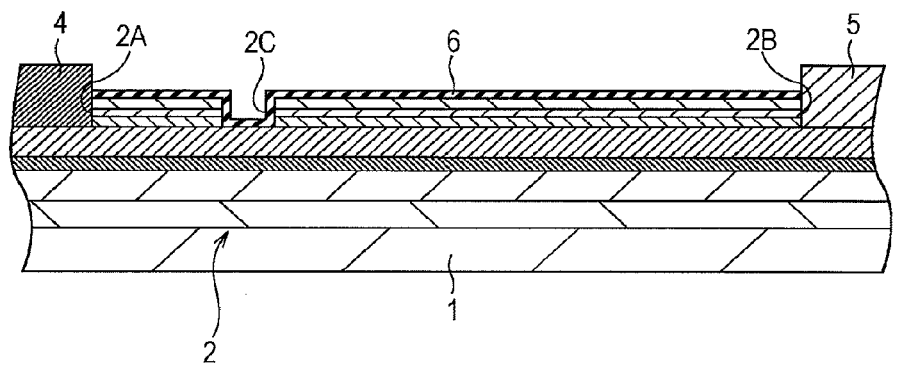
Figure 1F:
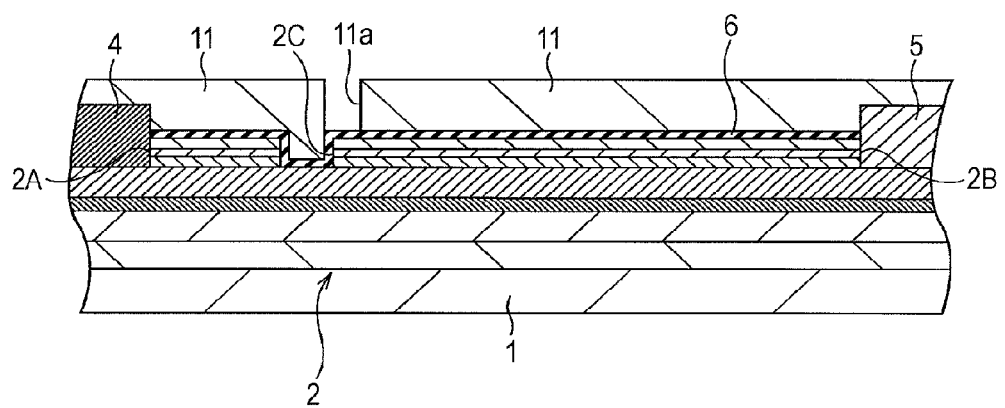

Referring now to FIG. 1D, an electrode groove 2C is formed at a position of the compound semiconductor multilayer structure 2 where a gate electrode is to be formed. In FIGS. 1D to 1F, the element isolation structure 3 may be omitted from the drawing. A position of the cap layer 2e where the gate electrode is to be formed is processed by lithography and dry etching. Inert gas such as Ar and a chlorine gas such as Cl$_2$ are used as the etching gas. The flow rate of Cl$_2$ may be, for example, 30 sccm, the pressure may be 2 Pa, and RF input power may be 20 W. An electrode groove 2C that exposes part of the surface of the electron supply layer 2d is formed in a position of the cap layer 2e where the gate electrode is to be formed. The electrode groove 2C may be formed in a side of the source electrode 4 from the center position between the source electrode 4 and the drain electrode 5. The electrode groove of the gate electrode may be formed in a surface layer of the cap layer 2e without penetrating the cap layer 2e or with penetrating the cap layer 2e and reaching the layer underneath. For example, an electrode groove that penetrates the cap layer 2e and reaches a surface layer portion of the electron supply layer 2d may be formed.

Referring to FIG. 1E, a gate insulating film 6 is formed. The gate insulating film 6 is formed by depositing an insulating material, e.g., Al$_2$O$_3$, on the compound semiconductor multilayer structure 2, the insulating material covering the inner wall surface of the electrode groove 2C. Al$_2$O$_3$ is, for example, deposited by atomic layer deposition (ALD). The thickness of Al$_2$O$_3$ may be about 5 nm to about 100 nm, e.g., about 40 nm.

Deposition of Al$_2$O$_3$ may be conducted by chemical vapor deposition (CVD) or the like. A nitride or oxynitride of Al, an oxide, nitride, or oxynitride of silicon (Si), or an oxide, nitride, or oxynitride of hafnium (Hf) may be deposited instead of Al$_2$O$_3$, for example. Two or more materials selected from these materials may be stacked to form a multilayer gate insulating film.

Referring to FIG. 1F, a resist mask 11 is formed on the gate insulating film 6. A resist is applied to the gate insulating film 6 and processed by lithography. As a result, a resist mask 11 having an opening 11a is formed on the gate insulating film 6. The opening 11a may be formed as a long groove that exposes a drain-electrode-5-side edge portion of the electrode groove 2C in the gate insulating film 6 in a longitudinal direction of the gate electrode to be formed, e.g., a direction orthogonal to the gate length direction.

Figure 1G:
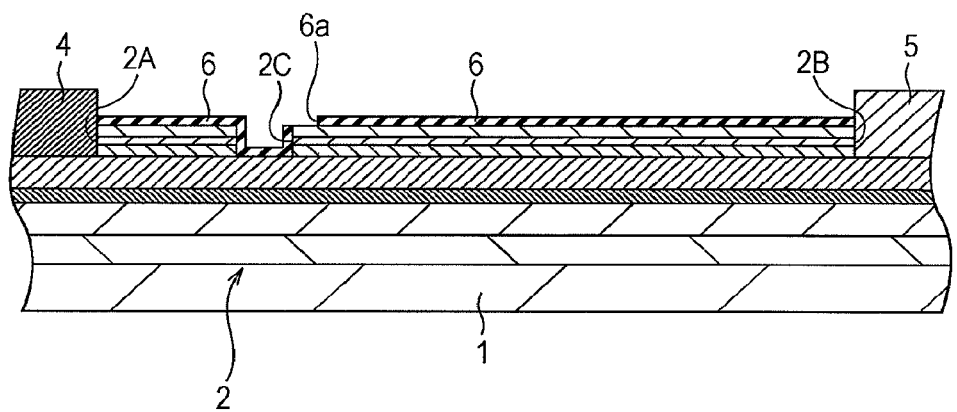

Referring to FIG. 1G, an opening 6a is formed in the gate insulating film 6. The gate insulating film 6 is dry-etched using the resist mask 11. Part of the gate insulating film 6 exposed in the opening 11a of the resist mask 11 is removed, and the opening 6a is formed in the gate insulating film 6 as a result. The opening 6a may be formed as a long groove that exposes a drain-electrode-5-side edge portion of the electrode groove 2C in the cap layer 2e in a longitudinal direction of the gate electrode to be formed. The length of the opening 11a may be substantially the same as the length of the electrode groove 2C in the longitudinal direction of the electrode groove 2C. A depletion layer may expand in the lateral direction in each portion in the longitudinal direction of the gate electrode and the device efficiency and voltage resistance may be improved. The resist mask 11 may be removed by ashing or the like.

Figure 1H:
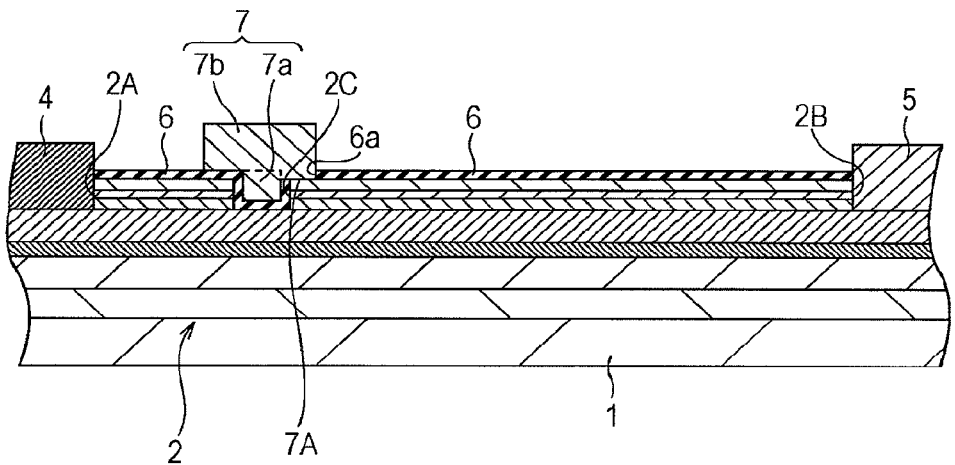

Referring now to FIG. 1H, a gate electrode 7 is formed. A lower layer resist, e.g., PMGI produced by US MicroChem Corp., and an upper resist, e.g., PFI32-A8 produced by Sumitomo Chemical Co., Ltd., are applied to the gate insulating film 6 by spin coating. Ultraviolet light exposure is conducted to form an opening having a spot size of about 0.8 μm in the upper layer resist. The lower resist layer is wet-etched with an alkaline developing solution by using the upper resist as a mask. A gate metal is vapor-deposited on the entire surface including the inside of the opening by using the upper layer resist and the lower layer resist as a mask. For example, Ni having a thickness of about 10 nm and Au having a thickness of about 300 nm may be vapor-deposited. Lift-off is conducted with a heated organic solvent and as a result the lower layer resist, the upper layer resist, and the gate metal on the upper layer resist are removed. As a result, a gate electrode 7 is formed by filling the electrode groove 2C with a portion of the gate metal via the gate insulating film 6.

The gate electrode 7 includes a gate base portion 7a corresponding to the portion where the electrode groove 2C is buried with the gate metal and a gate umbrella portion 7b which are formed on the gate base portion 7a and has a wider width in the gate length direction (gate width direction) than that of the gate base portion 7a. The boundary between the gate base portion 7a and the gate umbrella portion 7b is indicated by a broken line. The drain-electrode-5-side lower surface of the gate umbrella portion 7b, e.g., a drain-side lower surface 7A, in the opening 6a of the gate insulating film 6 makes direct contact, e.g., Schottky contact, with the cap layer 2e of the compound semiconductor multilayer structure 2. The AlGaN/GaN HEMT may employ a MIS-type structure and a Schottky-type structure in some part. For example, the gate insulating film 6 is formed between the compound semiconductor multilayer structure 2 and the source-electrode-4-side lower surface of the gate umbrella base 7b and the gate base portion 7a to form a MIS-type structure. The drain-electrode-side lower surface 7A of the gate umbrella portion 7b is in direct contact with the compound semiconductor multilayer structure 2 to form a Schottky-type structure.

After a protective film is formed, a contact between the gate electrode 7 and the source electrode 4 and between the gate electrode 7 and the drain electrode 5 may be formed. As a result, a MIS-type AlGaN/GaN HEMT may be formed.

Figure 2A:
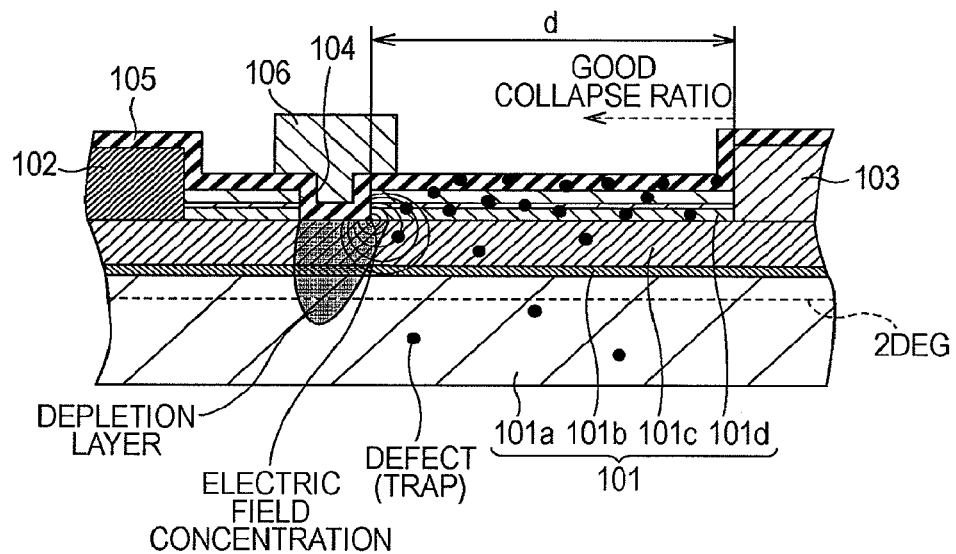
FIG. 2A illustrates an exemplary MIS-type AlGaN/GaN HEMT.
Figure 2B:
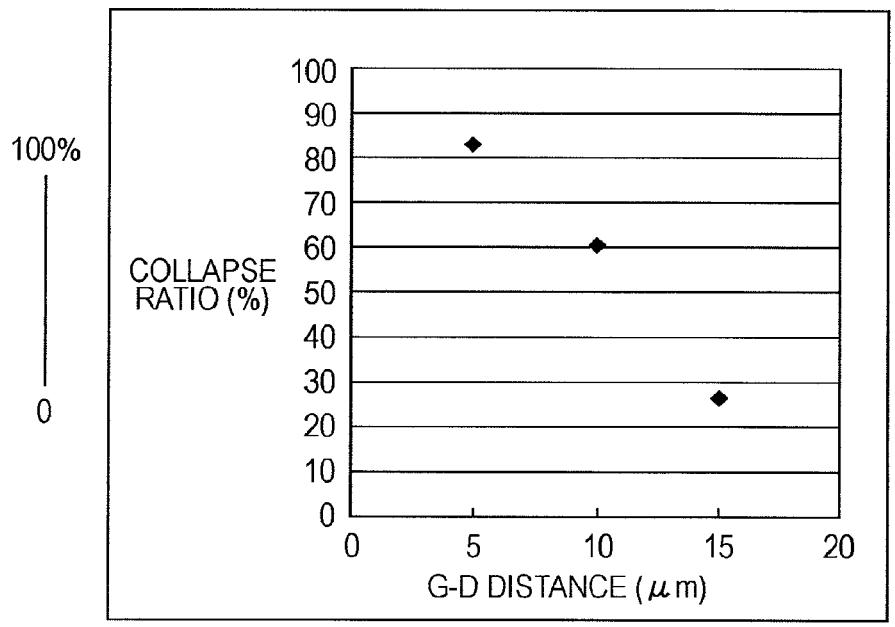
FIG. 2B is an exemplary relationship between a distance between a gate electrode and a drain electrode and a current collapse ratio.
Figure 3A:
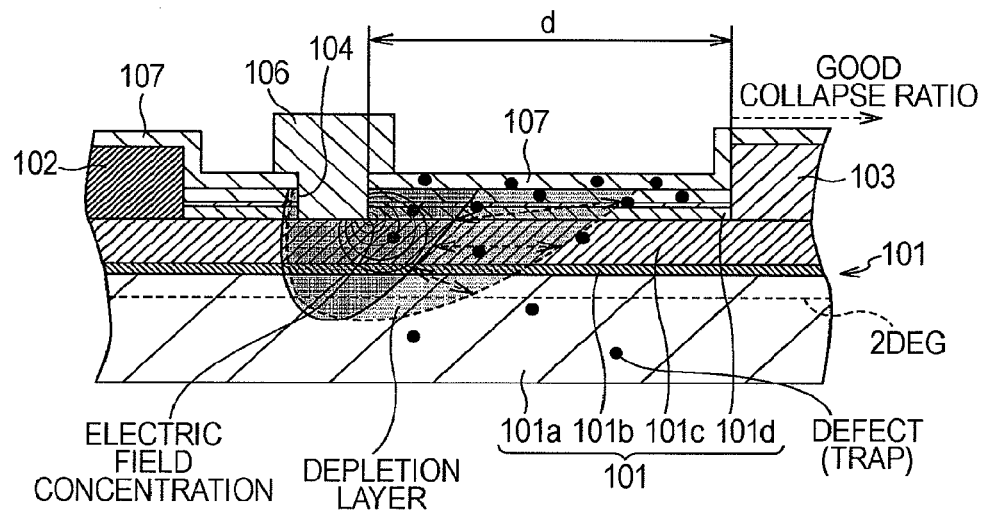
FIG. 3A illustrates an exemplary Schottky-type AlGaN/GaN HEMT.
Figure 3B:
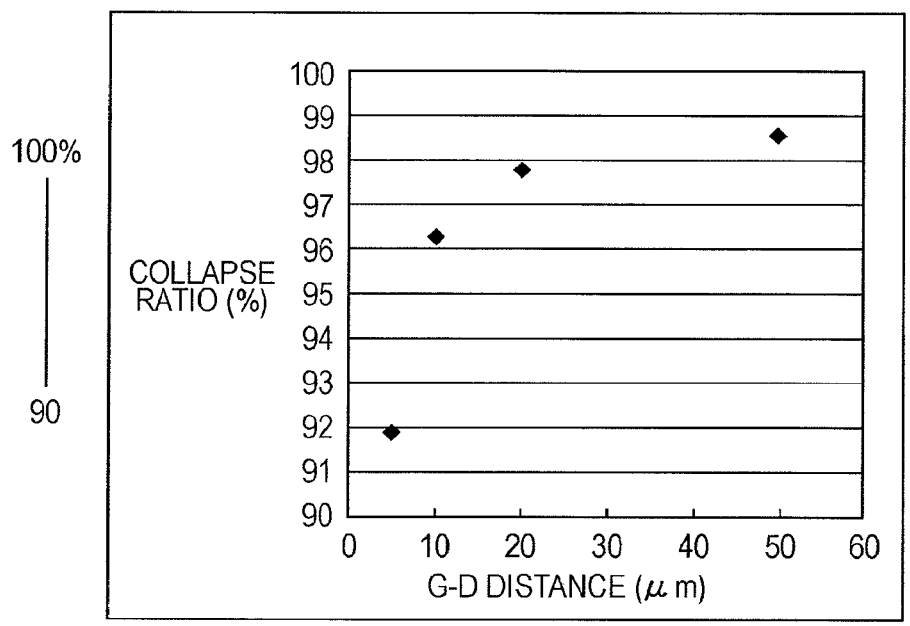
FIG. 3B is an exemplary relationship between a distance between a gate electrode and a drain electrode and the current collapse ratio.

FIG. 2A illustrates an exemplary MIS-type AlGaN/GaN HEMT. FIG. 2B is an exemplary relationship between a distance between a gate electrode and a drain electrode and a current collapse ratio. The gate electrode and the drain electrode illustrated in FIG. 2B may be the gate electrode and the drain electrode of HEMT in FIG. 2A. The unit of the distance may be μm, and the unit of the current collapse ratio may be %. FIG. 3A illustrates an exemplary Schottky-type AlGaN/GaN HEMT. FIG. 3B is an exemplary relationship between a distance between a gate electrode and a drain electrode and a current collapse ratio. The gate electrode and the drain electrode illustrated in FIG. 3B may be the gate electrode and the drain electrode of HEMT in FIG. 3A. The unit of the distance may be μm, and the unit of the current collapse ratio may be %.

In FIGS. 2A and 3A, the structure of an upper part of the substrate is illustrated and an element isolation structure may not be illustrated. Compound semiconductor multilayer structures 101 in FIGS. 2A and 3A each include an electron transit layer 101a including i-GaN, an intermediate layer 101b including i-AlGaN, an electron supply layer 101c including n-AlGaN, and a cap layer 101d including n-GaN, AlN, and n-GaN sequentially stacked. A source electrode 102 and a drain electrode 103 are also illustrated. In FIG. 2A, an electrode groove 104 formed by buring an electrode groove 104 formed in the cap layer 101d via the gate insulating film 105 is illustrated. In FIG. 3A, a gate electrode 106 that is formed by buring the electrode groove 104 and makes a Schottky contact with the electron supply layer 101c is illustrated. In FIG. 3A, a protective film 107 covering the cap layer 101d is formed. The distance between the gate electrode 106 and the drain electrode 103 (G-D distance) may be a distance d between the edge portion of the electrode groove 104 and the edge portion of the drain electrode 103 as illustrated in the drawings.

Referring to FIG. 2B, the current collapse ratio of a MIS-type AlGaN/GaN HEMT decreases with the increase in G-D distance. The influence of the current collapse may become stronger as the G-D distance is increased. For example, the transconductance (gm) of the drain current (e.g., clogging of the drain current) may be decreased.

Referring to FIG. 3B, the current collapse ratio of a Schottky-type AlGaN/GaN HEMT increases with the G-D distance. The influence of the current collapse may become weaker as the G-d distance is increased. For example, clogging of the drain current may be decreased.

When the electric field concentration occurs in the edge portion of the gate electrode between the gate and drain, traps which are positioned inside and in a surface of the compound semiconductor multilayer structure and an insulator such as the gate insulating film, for example, defects are generated. Since electros are trapped in these defects, the current collapse, i.e., a phenomenon of a decrease in drain current, may occur. The shape of the depletion layer of the MIS-type AlGaN/GaN HEMT illustrated in FIG. 2A rarely depends on the G-D distance and the depletion layer may lie directly below the gate electrode 106. The depletion layer may lie only in the portion directly below the gate electrode 106. As the G-D distance is increased, the number of traps lying between the gate and drain may be increased and the total number of electrons captured in the traps may be increased. Therefore, clogging of the drain current may increase. In the MIS-type AlGaN/GaN HEMT, the electric field concentration in the edge portion of the gate electrode may be intensified as the G-D distance is decreased.

The shape of the depletion layer of the Schottky-type AlGaN/GaN HEMT illustrated in FIG. 3B may expand and contract in a lateral direction, e.g., a horizontal direction, in response to the G-D distance. The depletion layer may expand in the lateral direction between the gate and drain as the G-D distance is increased. Expansion of the depletion layer between the gate and drain may increase the number of traps incorporated in the depletion layer. The traps incorporated in the depletion layer may not capture electrons. As the G-D distance is increased, the number of traps incorporated in the expanded depletion layer may become larger than the number of traps that lie between the gate and drain. Accordingly, the total number of electrons captured by the traps may be decreased and the clogging of the drain current may be reduced.

Since the MIS-type structure is maintained while reliably maintaining a high threshold value and a Schottky-type structure is employed in some part, clogging of the drain current may be reduced. Referring to FIG. 1H, the opening 6a is formed in the gate insulating film 6 to form the gate electrode 7. An AlGaN/GaN HEMT which has a MIS-type structure, a Schottky-type structure added to the drain-side of the gate electrode 7 and good device efficiency and breakdown voltage is provided.

Referring to FIG. 1H, the gate electrode 7 is formed at a source-electrode-4-side position from the center position between the source electrode 4 and the drain electrode 5, e.g., a position away from the drain electrode 5. Accordingly, the G-D distance is reliably maintained and clogging of the drain current may be reduced.

An AlGaN/GaN HEMT of a MIS type suitable for normally off mode and having improved current collapse characteristics, good device efficiency and good breakdown voltage is provided.

A dielectric structure that alleviates electric field concentration at the gate electrode may be added to the MIS-type AlGaN/GaN HEMT illustrated in FIG. 1H. FIGS. 4A to 4G illustrate an exemplary method for manufacturing a compound semiconductor device. A MIS-type AlGaN/GaN HEMT may be manufactured by the method illustrated in FIGS. 4A to 4G. In FIGS. 4A to 4G, the element isolation structure 3 may be omitted.

Figure 4A:
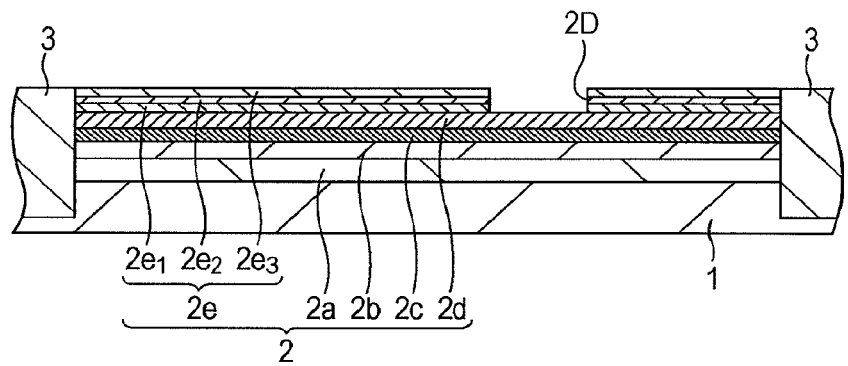
FIGS. 4A to 4G illustrate an exemplary method for manufacturing a compound semiconductor device.

Referring to FIG. 4A, a dielectric groove 2D is formed in the compound semiconductor multilayer structure 2. For example, a position in the cap layer 2e between where the gate electrode is to be formed and where the drain electrode is to be formed is processed by lithography and dry etching. Inert gas such as Ar and chlorine gas such as $Cl_2$ may be used as the etching gas. The flow rate of $Cl_2$ may be, for example, 30 sccm, the pressure may be 2 Pa, and RF input power may be 20 W. The dielectric groove 2D that exposes part of the surface of the electron supply layer 2d is formed in the cap layer 2e. The dielectric groove 2D may be formed in the surface layer of the cap layer 2e without penetrating the cap layer 2e or with penetrating the cap layer 2e and reaching the layer underneath. For example, the dielectric groove 2D may penetrate the cap layer 2e and reach the surface layer portion of the electron supply layer 2d.

Figure 4B:
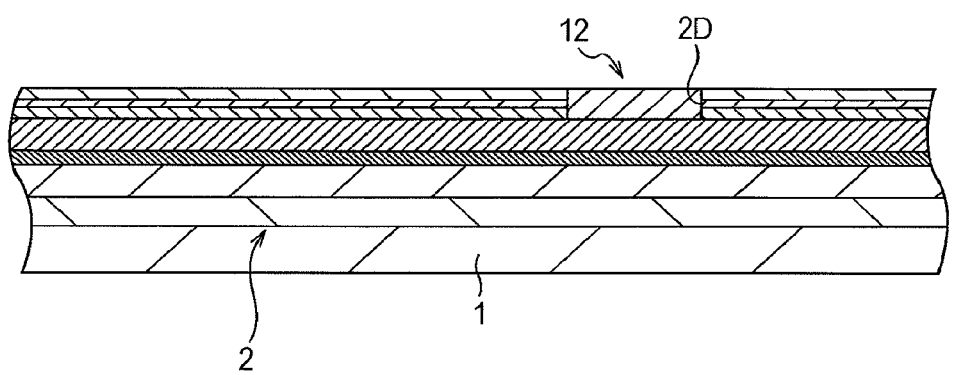

Referring to FIG. 4B, a dielectric structure 12 is formed. A dielectric material, e.g., a high-dielectric material including a high-k insulating material may be deposited on the compound semiconductor multilayer structure 2 so as to fill the dielectric groove 2D. The high-dielectric material may include at least one selected from $SiO_2$, SiN, SiON, HfSiO, HfAlON, $HfO_2$, and $Y_2O_3$. For example, when HfSiO is used, HfSiO is deposited by chemical vapor deposition (CVD) or the like on the compound semiconductor multilayer structure 2 so as to fill the dielectric groove 2D. The deposited high-dielectric material is polished by, for example, chemical mechanical polishing (CMP) until the surface of the cap layer 2e is exposed. As a result, a dielectric structure 12 formed of the high-dielectric material filling the dielectric groove 2D is formed.

Figure 4C:
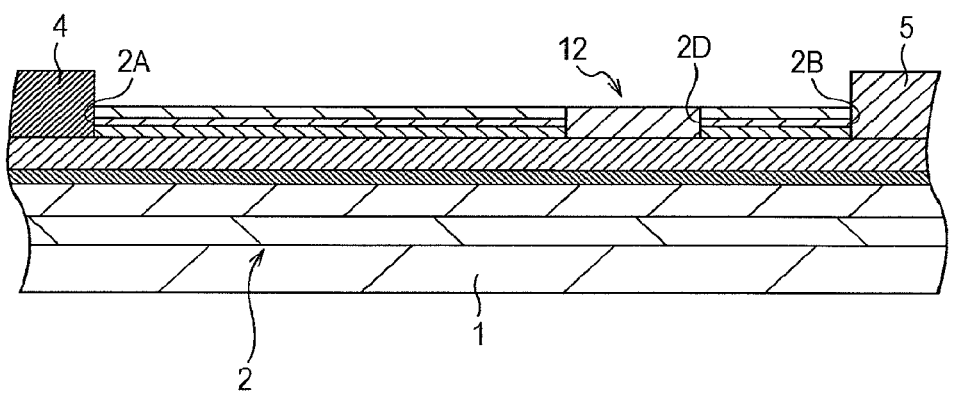
Figure 4D:
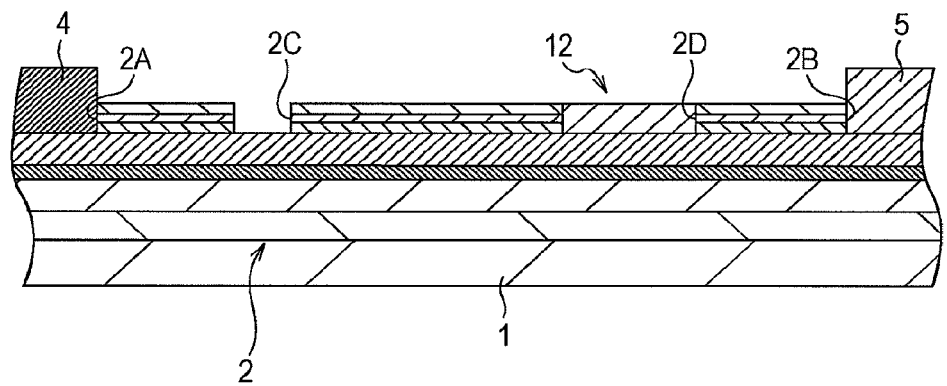

Referring to FIG. 4C, a source electrode 4 and a drain electrode 5 are formed. Referring to FIG. 4D, an electrode groove 2C is formed in the compound semiconductor multilayer structure 2 in a position where a gate electrode is to be formed. The dielectric groove 2D may be formed to have substantially the same length as that of the electrode groove 2C in the longitudinal direction of the electrode groove 2C. The effect of alleviating (scattering) electric field concentration may be obtained in respective portions in the longitudinal direction of the gate electrode. The device efficiency and breakdown voltage may be improved.

Figure 4E:
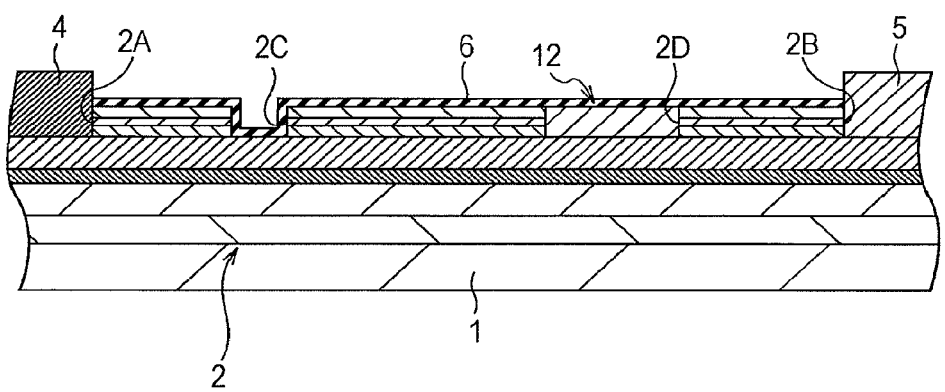
Figure 4F:
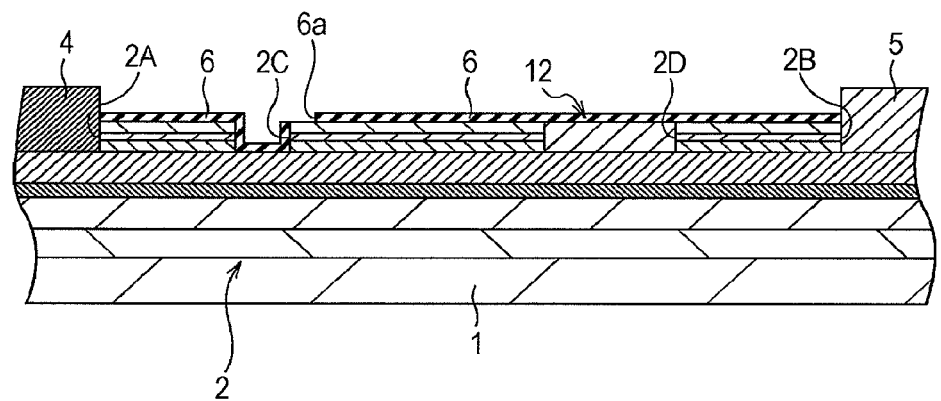
Figure 4G:
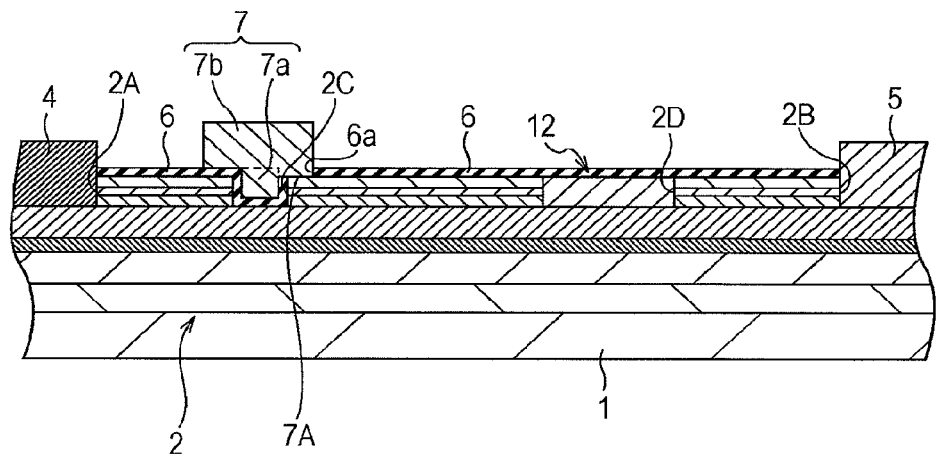

Referring to FIG. 4E, a gate insulating film 6 is formed. Referring to FIG. 4F, an opening 6a is formed in the gate insulating film 6. Referring to FIG. 4G, a gate electrode 7 is formed.

After a protective film is formed, contacts between the source electrode 4 and the gate electrode 7 and between the drain electrode 5 and the gate electrode 7 are formed. As a result, a MIS-type AlGaN/GaN HEMT is formed.

Figure 5:
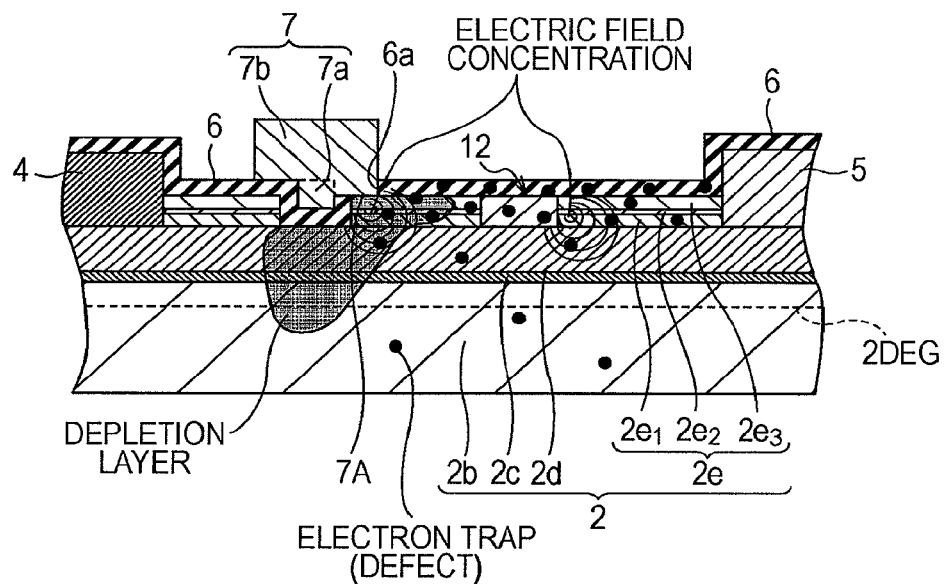
FIG. 5 illustrates an exemplary compound semiconductor device.

FIG. 5 illustrates an exemplary compound semiconductor device. The compound semiconductor device illustrated in FIG. 5 may be an AlGaN/GaN HEMT. In FIG. 5, for the convenience of illustration, the structure of an upper part of the substrate is illustrated and the element isolation structure may be omitted from the drawing.

Electric field concentration occurs in an edge portion of the gate electrode between the gate and drain and electrons are captured by traps inside and in a surface of the compound semiconductor multilayer structure or an insulator such as a gate insulating film, resulting in current collapse. Referring to FIG. 5, a Schottky-type structure is added to the drain-side of the gate electrode 7 and a dielectric structure 12 is formed between the gate and drain. Clogging of a drain current may be reduced due to the Schottky-type structure. The dielectric structure 12 may alleviate the electric field concentration at the drain-side edge portion of the gate electrode 7. When no dielectric structure 12 is formed, electric field concentration that occurs in the drain-side edge portion of the gate electrode 7 may be scattered into the drain-side edge portion of the dielectric structure 12. The electric field concentration in the drain-side edge portion of the gate electrode 7 may be alleviated by an amount corresponding to the scattering. Since the Schottky-type structure is added to the drain-side of the gate electrode 7 and the dielectric structure 12 is provided between the gate and drain, the current collapse characteristic may be improved.

The dielectric structure 12 is formed by filling the dielectric groove 2D in the cap layer 2e with a high-dielectric material. A drain current flows between the gate and drain of the compound semiconductor multilayer structure 2. Since the dielectric structure 12 is formed in the current path, the electric field concentration in the edge portion of the dielectric structure 12 may be scattered and the electric field concentration in the edge portion of the gate electrode 7 may be alleviated.

Since the dielectric groove 2D is formed in the cap layer 2e and the insulating property of the material filling the dielectric groove 2D is high, the flow of the drain current between the gate and drain may be decreased. When the material filling the dielectric groove 2D includes a metal and the like, a leakage path may be generated by metal diffusion that occurs during the manufacturing process. When the material includes the above-described high-dielectric material, the leakage path may be reduced without decreasing the flow of the drain current.

An AlGaN/GaN HEMT that has a MIS-type structure suitable for normally off mode and exhibits improved current collapse characteristics and good device efficiency and breakdown voltage is provided.

The dielectric structure may be formed without forming the dielectric groove 4D. For example, the dielectric structure may be formed by forming a high-dielectric material by patterning at a position substantially the same as the position of the dielectric groove 4D between the gate and drain. Scattering of the electric field concentration improves the current collapse characteristics and improves the device efficiency and breakdown voltage of the AlGaN/GaN HEMT.

For example, the dielectric structure 12 may be formed between the gate and drain without adding of the Schottky-type structure to the drain side of the gate electrode 7 and forming the opening 6a in the gate insulating film 6.

Figure 6:
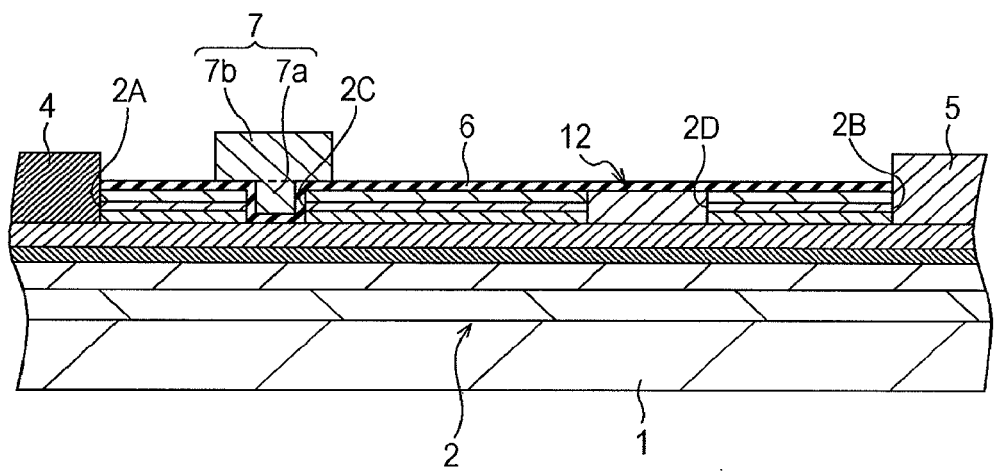
FIG. 6 illustrates an exemplary compound semiconductor device.

FIG. 6 illustrates an exemplary compound semiconductor device. The compound semiconductor device illustrated in FIG. 6 may be an AlGaN/GaN HEMT. For example, a gate electrode 7 of the AlGaN/GaN HEMT illustrated in FIG. 6 may be formed by performing processes illustrated in FIGS. 1A, 1B, 4A to 4E, and 4G. In FIG. 6, the element isolation structure may be omitted from the drawing. After a protective film is formed, contacts the source electrode 4, the gate electrode 7 and the drain electrode 5 are formed. As a result, a MIS-type AlGaN/GaN HEMT may be formed.

The dielectric structure 12 alleviates the electric field concentration in a drain-side edge portion of the gate electrode and improves the current collapse characteristics. The current collapse characteristics are improved while employing a MIS type structure suitable for a normally off mode and thus the device efficiency and breakdown voltage of the AlGaN/GaN HEMT are improved.

The SiC substrate 1 may be used as the substrate. Other substrates may be used instead. When an epitaxial structure having a function of a field effect transistor includes a nitride semiconductor, a substrate including sapphire, Si, GaAs, or the like may be used. The substrate may be semi-insulating or conductive. The layer structures of the source electrode 4, the drain electrode 5, and the gate electrode 7 may be arbitrary and may be a single layer or a multilayer. The method for forming the electrodes may be arbitrary. A heat treatment may be conducted during formation of the source electrode 4 and the drain electrode 5. A heat treatment may be omitted as long as the ohmic characteristics are obtained and another heat treatment may be performed after formation of the gate electrode 7. The cap layer 2e may be formed of three layers, may be a single layer composed of n-GaN, or may be a cap layer including four or more compound semiconductor layers. The electrode groove 2C for forming the gate electrode 7 may or may not be formed.

Figure 7:
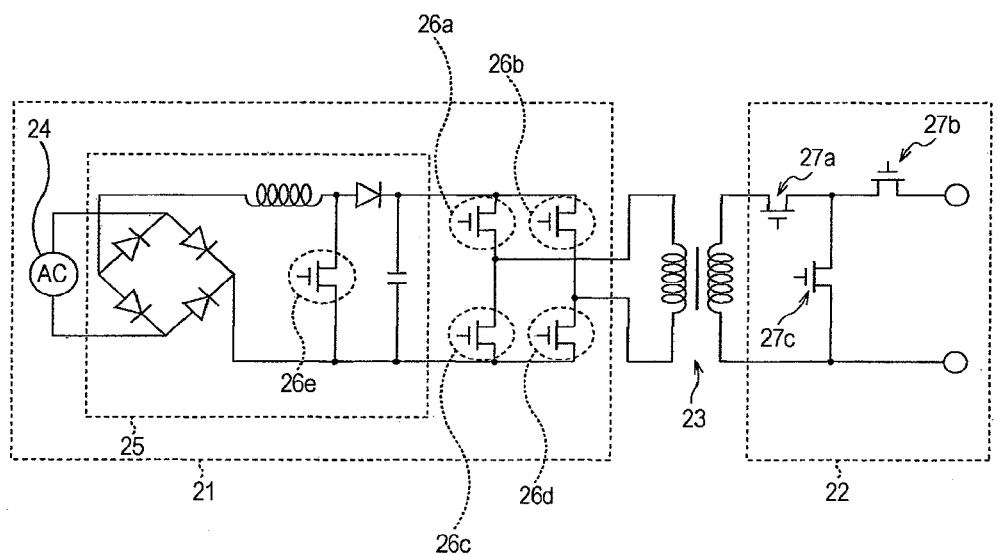
FIG. 7 illustrates an exemplary power supply device.

FIG. 7 illustrates an exemplary a power supply device. The power supply device in FIG. 7 may include the AlGaN/GaN HEMT described above.

The power supply device in FIG. 7 includes a high-voltage primary side circuit 21, a low-voltage secondary side circuit 22, and a transformer 23 between the primary side circuit 21 and the secondary side circuit 22. The primary side circuit 21 includes an AC power source 24, a bridge rectifier circuit 25, and a plurality of, e.g., four, switching elements 26a, 26b, 26c, and 26d. The bridge rectifier circuit 25 includes a switching element 26e. The secondary side circuit 22 includes a plurality of, for example, three, switching elements 27a, 27b, and 27c.

The switching elements 26a, 26b, 26c, 26d, and 26e of the primary side circuit 21 may each be an AlGaN/GaN HEMT. The switching elements 27a, 27b, and 27c of the secondary side circuit 22 may each be a metal-insulator-semiconductor field-effect transistor (MIS-FET) using silicon.

An AlGaN/GaN HEMT of a MIS-type suitable for a normally off mode and having good current collapse characteristics, device efficiency, and breakdown voltage is used in the high-voltage circuit.

Figure 8:
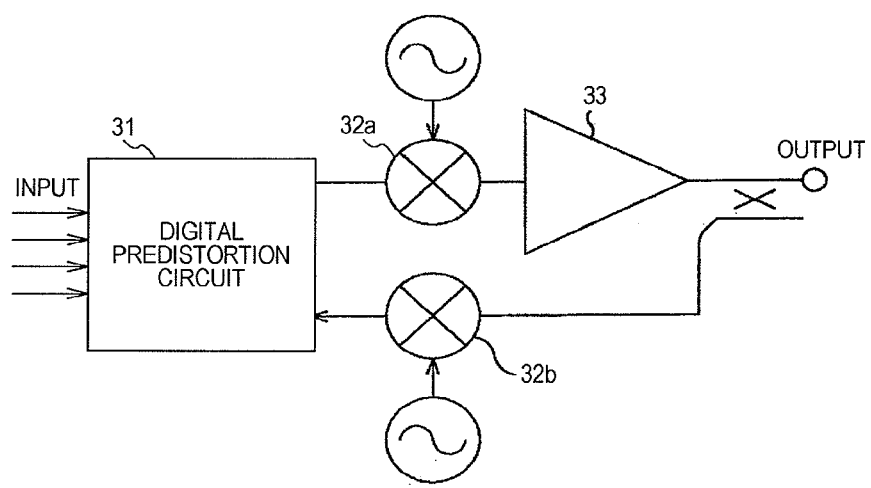
FIG. 8 illustrates an exemplary high-frequency amplifier.

FIG. 8 illustrates an exemplary high-frequency amplifier. The high-frequency amplifier in FIG. 12 may be the AlGaN/GaN HEMT described above.

The high-frequency amplifier in FIG. 8 includes a digital predistortion circuit 31, mixers 32a and 32b, and a power amplifier 33. The digital predistortion circuit 31 compensates nonlinear distortions of an input signal. The mixer 32a mixes the input signal obtained by compensating nonlinear distortions with an AC signal. The power amplifier 33 amplifies the input signal mixed with the AC signal. The power amplifier 33 may be the AlGaN/GaN HEMT described above. For example, an output-side signal may be mixed with an AC signal by the mixer 32b based on switching and may be transmitted to the digital predistortion circuit 31.

An AlGaN/GaN HEMT of a MIS-type suitable for a normally off mode and having good current collapse characteristics, device efficiency, and breakdown voltage is used in the high-frequency amplifier.

The compound semiconductor device described above may be used as the following HEMTs in addition to the AlGaN/GaN HEMT.

The compound semiconductor device may include an InAlN/GaN HEMT. The lattice constant of InAlN may approach the lattice constant of GaN by adjusting the compositions of InAlN and GaN. The electron transit layer may be i-GaN. The intermediate layer may be i-InAlN. The electron supply layer may be n-InAlN. The cap layer may include three layers respectively including n-GaN, AlN, and n-GaN. Since piezoelectric polarization is reduced, the two dimensional electron gas may be generated by spontaneous polarization of InAlN.

An InAlN/GaN HEMT of a MIS-type suitable for a normally off mode and having good current collapse characteristics, device efficiency, and breakdown voltage is provided.

The compound semiconductor device may include InAlGaN/GaN HEMT. The lattice constant of GaN may be larger than the lattice constant of InAlGaN. The electron transit layer may be i-GaN. The intermediate layer may be i-InAlGaN. The electron supply layer may be n-InAlGaN. The cap layer may include three layers respectively including n-GaN, AlN, and n-GaN.

The current collapse characteristics, device efficiency, and breakdown voltage of a MIS-type compound semiconductor device suitable for normally off mode are improved.

Example embodiments of the present invention have now been described in accordance with the above advantages. It will be appreciated that these examples are merely illustrative of the invention. Many variations and modifications will be apparent to those skilled in the art.

The invention claimed is:

1. A method for manufacturing a compound semiconductor device, comprising:
    forming a gate insulating film on a compound semiconductor multilayer structure;
    forming an opening on the gate insulating film to expose a part of a surface of the compound semiconductor multilayer structure, wherein said opening is surrounded by a vertical sidewall of said gate insulating film; and
    forming a gate electrode, which include a gate base portion and a gate umbrella portion, on the gate insulating film so that a surface of the gate umbrella portion includes a Schottky contact with the compound semiconductor multilayer structure in the opening and an entire surface of the gate base portion is in contact with the compound semiconductor multilayer structure indirectly so as to be the gate insulating film between the entire surface and the compound semiconductor multilayer structure.

2. The method according to claim 1, further comprising, forming a dielectric body on the compound semiconductor multilayer structure along with the gate electrode.

3. The method according to claim 2, further comprising:
    forming a second groove in the compound semiconductor multilayer structure and filling the second groove to form the dielectric body.

4. The method according to claim 1, wherein the opening is formed in the gate insulating film in a longitudinal direction of the gate electrode.

5. The method according to claim 1, further comprising:
forming a first groove in the compound semiconductor multilayer structure; and
   filling the first groove to form the gate base portion.
6. The method according to claim 1, further comprising:
   forming a source electrode on one side of the gate electrode on the compound semiconductor multilayer structure;
   forming a drain electrode on the other side of the gate electrode on the compound semiconductor multilayer structure,
   wherein the Schottky contact is made between the compound semiconductor multilayer structure and the surface of the gate umbrella portion on the other side of the gate electrode.
7. The method according to claim 1, further comprising,
   forming a source electrode on one side of the gate electrode on the compound semiconductor multilayer structure;
   forming a drain electrode on the other side of the gate electrode on the compound semiconductor multilayer structure; and
   forming a dielectric body between the gate electrode and the drain electrode.

\* \* \* \* \*